United States Patent
Shimada (10) Patent No.: US 9,214,573 B2
(45) Date of Patent: Dec. 15, 2015

(54) BYPASS DIODE

(71) Applicant: Keiji Shimada, Osaka (JP)

(72) Inventor: Keiji Shimada, Osaka (JP)

(73) Assignee: Sharp Kabushiki Kaisha, Osaka-shi, Osaka ( * ) Notice: Subject to any disclaimer, the term of this patent is extended or adjusted under 35 U.S.C. 154(b) by 0 days.

(21) Appl. No.: 14/357,318

(22) PCT Filed: Oct. 29, 2012

(86) PCT No.: PCT/JP2012/077869
§ 371 (c)(1),
(2) Date: May 9, 2014

(87) PCT Pub. No.: WO2013/069492
PCT Pub. Date: May 16, 2013

(65) Prior Publication Data
US 2014/0353806 A1   Dec. 4, 2014

(30) Foreign Application Priority Data

Nov. 9, 2011   (JP) ................... 2011-245373

(51) Int. Cl.
| | |
|---|---|
| *H01L 29/861* | (2006.01) |
| *H01L 23/00* | (2006.01) |
| *H01L 27/142* | (2014.01) |
| *H01L 29/06* | (2006.01) |
| *H01L 29/417* | (2006.01) |
| *H01L 29/66* | (2006.01) |
| *H01L 31/05* | (2014.01) |
| *H01L 31/0443* | (2014.01) |

(52) U.S. Cl.
CPC .......... *H01L 29/8611* (2013.01); *H01L 23/562* (2013.01); *H01L 27/1421* (2013.01); *H01L 29/0649* (2013.01); *H01L 29/417* (2013.01); *H01L 29/66128* (2013.01); *H01L 31/0443* (2014.12); *H01L 31/0504* (2013.01); *H01L 2924/0001* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2004/0224243 A1 | 11/2004 | Yoshizawa et al. | |
| 2009/0283141 A1* | 11/2009 | Bentzen et al. | ............... 136/256 |

FOREIGN PATENT DOCUMENTS

| | | |
|---|---|---|
| JP | 4-278589 | 10/1992 |
| JP | 6-53377 | 2/1994 |
| JP | 2004-056024 | 2/2004 |
| JP | 2004-186662 A | 7/2004 |
| JP | 2007-096040 | 4/2007 |
| JP | 2009-20468 A | 1/2009 |
| JP | 2009-158697 | 7/2009 |
| JP | 2011-176097 A | 9/2011 |

OTHER PUBLICATIONS

International Search Report for PCT/JP2012/077869, mailed Jan. 22, 2013.

* cited by examiner

*Primary Examiner* — Yasser A Abdelaziez
(74) *Attorney, Agent, or Firm* — Nixon & Vanderhye, P.C.

(57) ABSTRACT

A bypass diode includes a semiconductor substrate having a first surface and a second surface opposite to each other, a p electrode as a first conductive type electrode and an n electrode as a second conductive type electrode arranged on the first surface, a back surface electrode arranged on the second surface and having a polarity identical to that of the semiconductor substrate, a first oxide layer arranged on the first surface, and a second oxide layer arranged on the second surface.

8 Claims, 8 Drawing Sheets

BYPASS DIODE

This application is the U.S. national phase of International Application No. PCT/JP2012/077869 filed 29 Oct. 2012 which designated the U.S. and claims priority to JP Patent Application No. 2011-245373 filed 9 Nov. 2011, the entire contents of each of which are hereby incorporated by reference.

TECHNICAL FIELD

The present invention relates to a bypass diode for a solar cell. In particular, the present invention relates to a bypass diode which can be used for a space solar cell mounted in an artificial satellite, a space station, and the like.

BACKGROUND ART

Generally, a solar cell is used as a power source for an artificial satellite, a space station, and the like. The solar cell used for this purpose is desired to be lightweight, and a single crystal silicon solar cell with a thickness of, for example, about 0.1 mm is used. Further, in recent years, using a compound solar cell with a thickness of less than or equal to 0.05 mm has been under consideration. A plurality of such solar cells connected in series or in parallel constitute a solar cell module.

For example, when a solar cell module including a plurality of solar cells connected in series partially goes into a shadow, not only power is not generated but also a voltage is applied in an opposite direction in solar cells at the shadowed part, reducing an overall output of the solar cell module.

Figure 10:
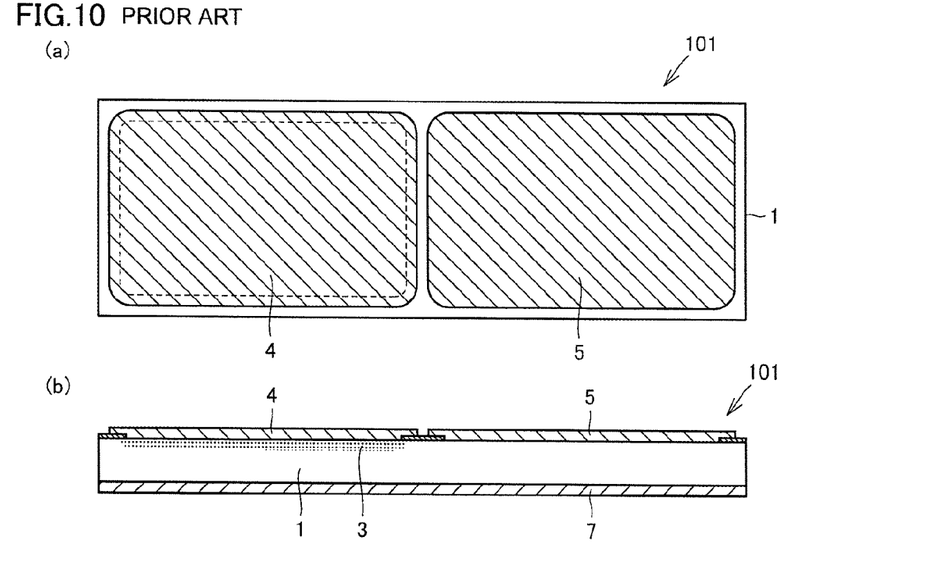

Further, in a solar cell module formed by connecting compound solar cells, a withstand voltage in the opposite direction is low, and the solar cells may be damaged when a voltage is applied in the opposite direction. In order to prevent such a situation, it is necessary to connect a bypass diode in parallel with each solar cell. A compound solar cell having a structure in which positive and negative electrodes of the solar cell are arranged on a light receiving surface side has been developed to facilitate connection between cells. In order to facilitate connection with such a solar cell, a bypass diode having positive and negative electrodes arranged on one surface has also been developed. For example, in a bypass diode 101 shown in FIGS. 10(a) and 10(b), a p electrode 4 and an n electrode 5 are provided on one surface of a semiconductor substrate 1.

Figure 11:
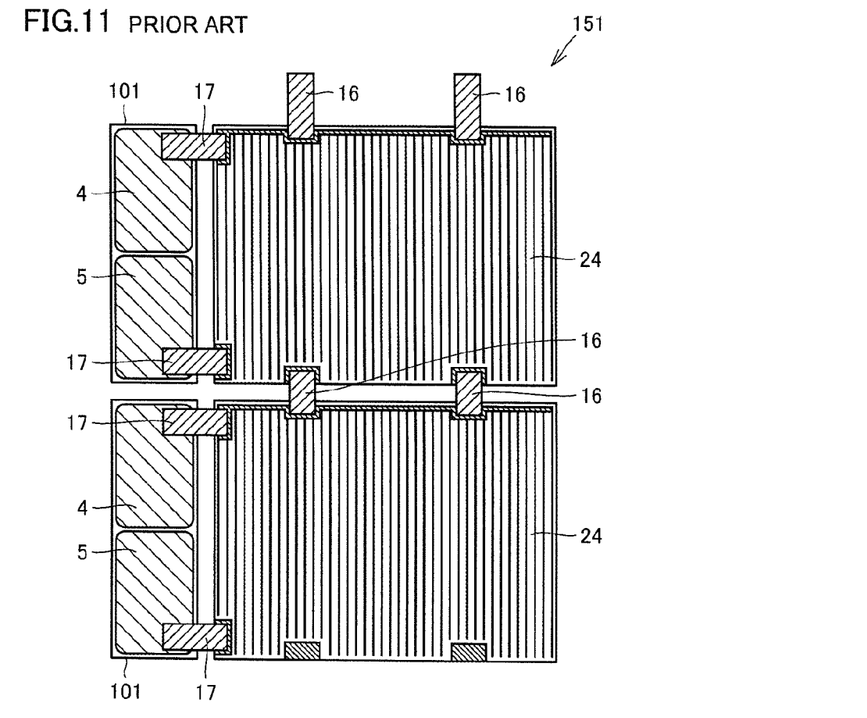
FIG. 11 is a plan view of a solar cell module using the bypass diodes in accordance with the conventional technique.

FIG. 11 shows one example of a method for connecting solar cells and the bypass diodes. A plurality of solar cells 24 are connected by interconnectors 16, thereby constituting a solar cell module 151. To connect solar cells 24, two interconnectors 16 are interposed in parallel. One bypass diode 101 is connected to each solar cell 24. To connect one solar cell 24 and one bypass diode 101, two interconnectors 17 are interposed in parallel. Connection by interconnectors 16, 17 are performed on one surface only.

Further, as described above, a very thin compound solar cell has been developed, and a very thin bypass diode has also been developed to be suitable for the solar cell.

Examples of Bypass Diode Described in Documents

Japanese Patent Laying-Open No. 6-53377 (PTD 1) describes one example of a diode used as a blocking diode or a bypass diode in a solar cell used as a power source for an artificial satellite and a space station operated in space.

Japanese Patent Laying-Open No. 2009-158697 (PTD 2) is an application by the same inventor and applicant as those of the present invention. PTD 2 describes a bypass diode for a solar cell configured such that a pn junction diode is provided and a p electrode and an n electrode are arranged on a main surface of a semiconductor substrate.

Conventional Manufacturing Method

A method for manufacturing a bypass diode in accordance with a conventional technique will be described with reference to FIGS. 12 to 20. This method corresponds to a method for manufacturing the bypass diode described in PTD 2.

Figure 12:
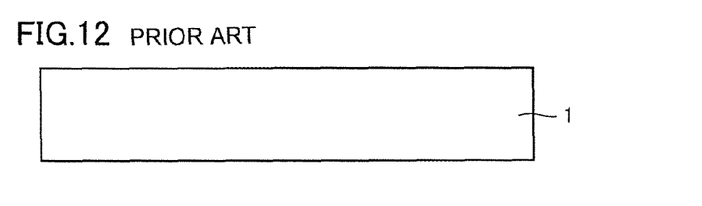
FIG. 12 is an explanatory view of a first step of a method for manufacturing the bypass diode in accordance with the conventional technique.

First, a semiconductor substrate obtained by slicing a silicon crystal ingot has a damaged layer in the vicinity of a surface thereof formed during slicing. Thus, using an acid or alkaline solution, the damaged layer is etched, and the semiconductor substrate is etched to have a desired thickness. Thereby, semiconductor substrate 1 shown in FIG. 12 is obtained.

Figure 13:
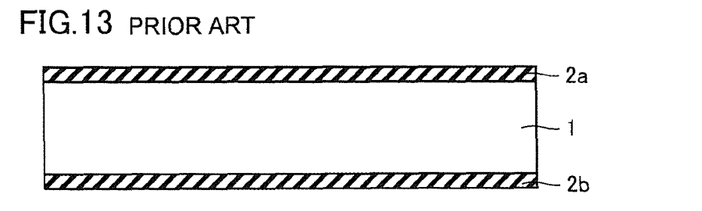
FIG. 13 is an explanatory view of a second step of the method for manufacturing the bypass diode in accordance with the conventional technique.

Next, semiconductor substrate 1 is placed into a quartz furnace heated to 1000 to 1200° C. to form oxide layers 2a, 2b on front and back surfaces of semiconductor substrate 1 using oxygen and water vapor. Thus, the state shown in FIG. 13 is obtained.

Figure 14:
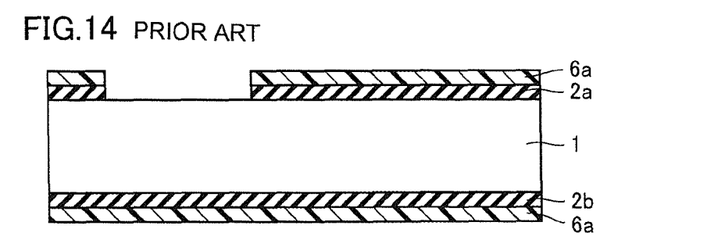
FIG. 14 is an explanatory view of a third step of the method for manufacturing the bypass diode in accordance with the conventional technique.

Next, as shown in FIG. 14, a pattern is formed on semiconductor substrate 1 using a photoresist 6a, and thereafter oxide layer 2a is etched to have a desired shape.

Figure 15:
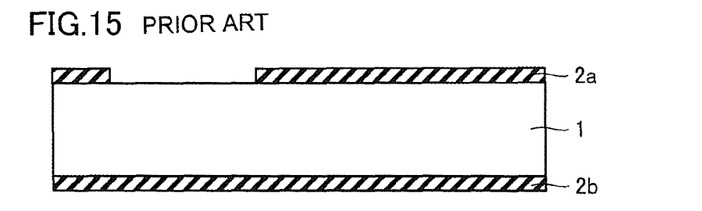
FIG. 15 is an explanatory view of a fourth step of the method for manufacturing the bypass diode in accordance with the conventional technique.
Figure 16:
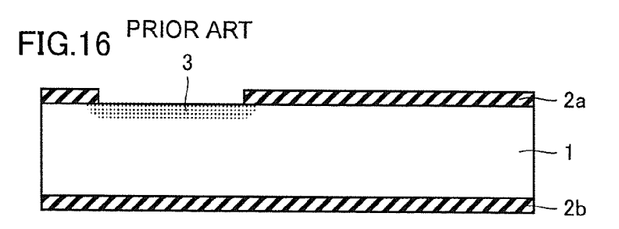
FIG. 16 is an explanatory view of a fifth step of the method for manufacturing the bypass diode in accordance with the conventional technique.

Next, photoresist 6a on semiconductor substrate 1 is removed to obtain the state shown in FIG. 15, and thereafter this structural body is placed into the quartz furnace heated to about 800 to 1100° C. and a gas containing boron is fed. Thereby, a p+ layer 3 is formed in the vicinity of the upper surface of semiconductor substrate 1 exposed at an opening in oxide layer 2a as shown in FIG. 16.

Figure 17:
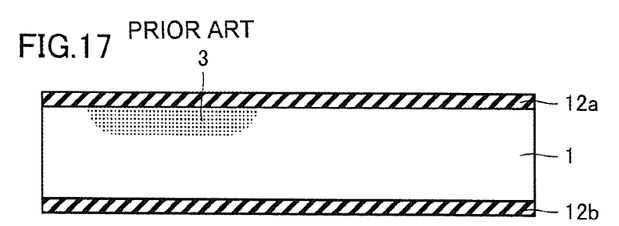
FIG. 17 is an explanatory view of a sixth step of the method for manufacturing the bypass diode in accordance with the conventional technique.

Next, this structural body is placed into the quartz furnace heated to 900 to 1200° C. to form oxide layers 12a, 12b on semiconductor substrate 1 using oxygen and water vapor as shown in FIG. 17. Oxide layers 12a, 12b are formed to incorporate previously formed oxide layers 2a, 2b therein. By this heat treatment, drive-in is performed simultaneously. The "drive-in" used herein means diffusing impurity atoms in the vicinity of the surface of a substrate into a deep position. On this occasion, it is desirable that the quartz furnace is set at a temperature higher than the temperature for diffusion. As a result of the drive-in, p+ layer 3 has an increased depth as shown in FIG. 17.

Figure 18:
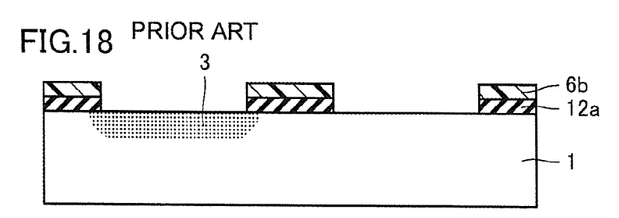
FIG. 18 is an explanatory view of a seventh step of the method for manufacturing the bypass diode in accordance with the conventional technique.
Figure 19:
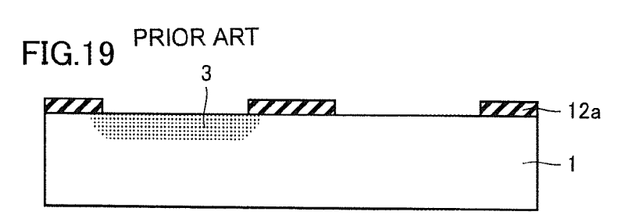
FIG. 19 is an explanatory view of an eighth step of the method for manufacturing the bypass diode in accordance with the conventional technique.

Next, as shown in FIG. 18, a pattern is formed on one surface using a photoresist 6b, and thereafter oxide layers 12a, 12b are etched to have desired shapes. Then, photoresist 6b is removed to obtain the structure shown in FIG. 19. Specifically, oxide layer 12a having a desired pattern remains on one surface, and oxide layer 12b is removed from the other surface.

Figure 20:
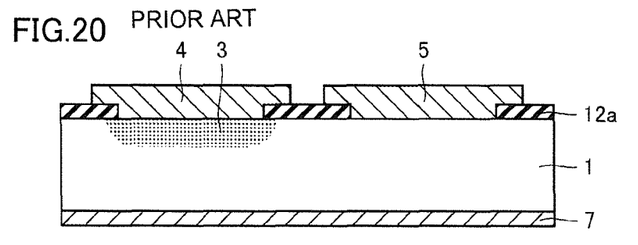
FIG. 20 is an explanatory view of a ninth step of the method for manufacturing the bypass diode in accordance with the conventional technique.

Next, as shown in FIG. 20, p electrode 4 and n electrode 5 are formed on the front surface of semiconductor substrate 1. A back surface electrode 7 is formed on the lower surface of semiconductor substrate 1.

Next, semiconductor substrate 1 is cut with a dicing saw, and thus chip-shaped bypass diodes are completed. Although a chip-shaped bypass diode is shown in FIGS. 12 to 20 for convenience of explanation, actually it is common to perform each step on a large-sized substrate and finally cut the substrate to obtain chip-shaped bypass diodes.

CITATION LIST

Patent Document

PTD 1: Japanese Patent Laying-Open No. 6-53377
PTD 2: Japanese Patent Laying-Open No. 2009-158697

SUMMARY OF INVENTION

Technical Problem

As a result of the etching of the oxide layer from FIG. 17 to FIG. 18, this structural body tends to be warped. When the structural body is warped at the time of FIG. 18, warpage remains when the structural body is completed as a bypass diode. A bypass diode with large warpage above a certain level is considered as a defective.

Accordingly, one object of the present invention is to provide a bypass diode with reduced warpage.

Solution to Problem

In order to achieve the above object, a bypass diode in accordance with the present invention includes a semiconductor substrate having a first surface and a second surface opposite to each other, a first conductive type electrode and a second conductive type electrode arranged on the first surface, a back surface electrode arranged on the second surface and having a polarity identical to that of the semiconductor substrate, a first oxide layer arranged on the first surface, and a second oxide layer arranged on the second surface.

Advantageous Effect of Invention

According to the present invention, since not only the first surface of the semiconductor substrate but also the second surface on the back side thereof are provided with oxide layers, warpage caused due to an oxide layer can be reduced.

BRIEF DESCRIPTION OF DRAWINGS

FIG. 10(a) is a plan view, and FIG. 10(b) is a cross sectional view, of a bypass diode in accordance with a conventional technique.

DESCRIPTION OF EMBODIMENTS

Embodiment 1

Figure 1:
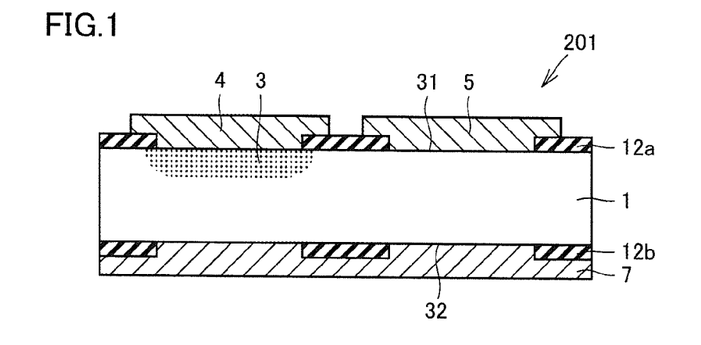
FIG. 1 is a cross sectional view of a bypass diode in Embodiment 1 in accordance with the present invention.

A bypass diode in Embodiment 1 in accordance with the present invention will be described with reference to FIGS. 1 and 2. As shown in FIG. 1, a bypass diode 201 in the present embodiment includes semiconductor substrate 1 having a first surface 31 and a second surface 32 opposite to each other, p electrode 4 as a first conductive type electrode and n electrode 5 as a second conductive type electrode arranged on first surface 31, back surface electrode 7 arranged on second surface 32 and having a polarity identical to that of semiconductor substrate 1, first oxide layer 12a arranged on first surface 31, and second oxide layer 12b arranged on second surface 32.

In the present embodiment, since not only first surface 31 but also second surface 32 of semiconductor substrate 1 are provided with oxide layers, warpage caused due to an oxide layer can be reduced.

Further, preferably, first oxide layer 12a and second oxide layer 12b are arranged symmetrically with semiconductor substrate 1 sandwiched therebetween, as illustrated in the present embodiment. When they are arranged symmetrically, comparable stresses are applied by the oxide layers to respective portions of the two surfaces, and thus warpage can be reduced effectively.

Figure 2:
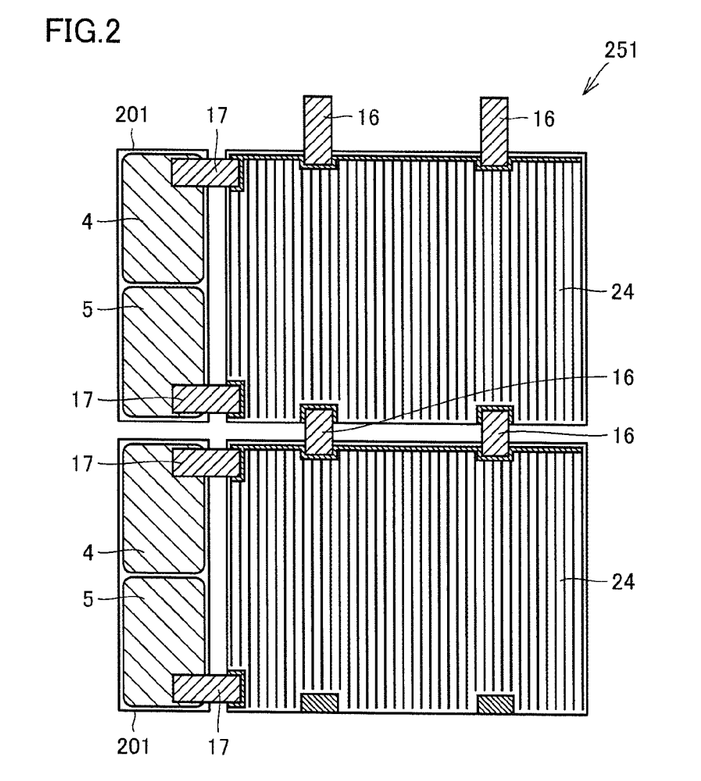
FIG. 2 is a plan view of a solar cell module using the bypass diodes in Embodiment 1 in accordance with the present invention.

FIG. 2 shows an example in which a plurality of solar cells 24 are connected using bypass diodes 201 to constitute a solar cell module. A solar cell module 251 includes a plurality of solar cells 24 and a plurality of bypass diodes 201. Each bypass diode 201 corresponds to each solar cell 24. Although FIG. 2 shows two solar cells 24, solar cell module 251 may be formed by connecting a greater number of solar cells 24.

Embodiment 2

A method for manufacturing a bypass diode in Embodiment 2 in accordance with the present invention will be described with reference to FIGS. 12 to 17 and FIGS. 3 to 5. The description will be given of the case of manufacturing bypass diode 201 illustrated in Embodiment 1.

The method for manufacturing the bypass diode in the present embodiment is basically identical to the method for manufacturing the bypass diode in accordance with the conventional technique, in the steps from FIGS. 12 to 17. However, in the step shown in FIG. 12, for a semiconductor substrate obtained by slicing a silicon crystal ingot, an acid or alkaline solution is used to etch a damaged layer and etch the semiconductor substrate to have a thickness of about 0.1 mm. Here, semiconductor substrate 1 may be n type or p type, and the size and the thickness of semiconductor substrate 1 are not limited to examples illustrated here.

Further, although the following description will be given using an n type semiconductor substrate for convenience, a p type semiconductor substrate may be used. When a p type semiconductor substrate is used, a p+ layer described below may be read as an n+ layer, and an n+ layer described below may be read as a p+ layer. However, conditions for diffusion and the like differ when an n type semiconductor substrate is used and when a p type semiconductor substrate is used.

Figure 3:
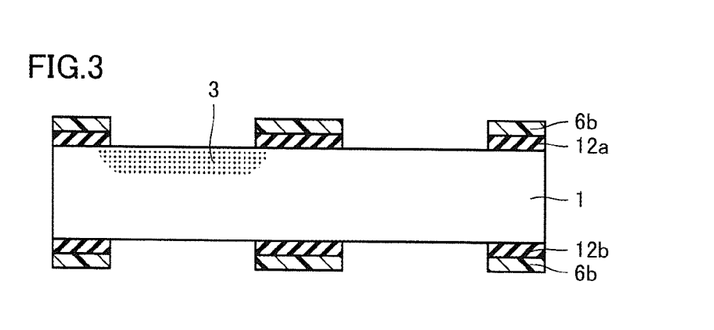
FIG. 3 is an explanatory view of a seventh step of a method for manufacturing a bypass diode in Embodiment 2 in accordance with the present invention.
Figure 4:
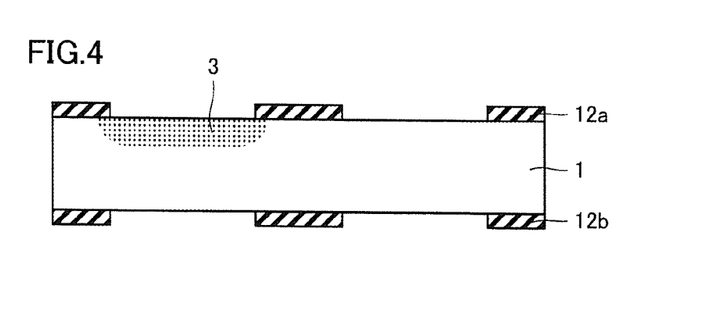
FIG. 4 is an explanatory view of an eighth step of the method for manufacturing the bypass diode in Embodiment 2 in accordance with the present invention.
Figure 5:
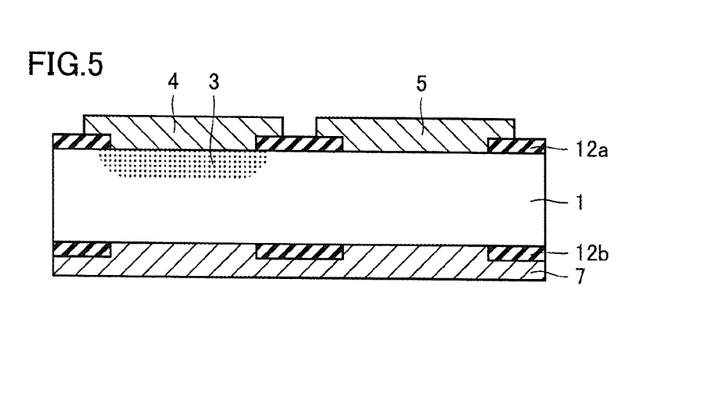
FIG. 5 is an explanatory view of a ninth step of the method for manufacturing the bypass diode in Embodiment 2 in accordance with the present invention.

In the method for manufacturing the bypass diode in the present embodiment, from the state shown in FIG. 17, patterns of photoresist 6b are formed on both of the upper and lower surfaces as shown in FIG. 3, instead of forming photoresist 6b on the upper surface only and entirely removing the oxide layer on the back surface as shown in FIG. 18 from the state shown in FIG. 17. Then, both of oxide layers 12a, 12b are patterned in the same manner. Thereafter, photoresist 6b is removed to obtain the state shown in FIG. 4. Next, as shown in FIG. 5, p electrode 4 and n electrode 5 are formed on the upper surface of semiconductor substrate 1.

Preferably, highly conductive materials such as silver and aluminum are used as electrode materials for p electrode 4 and n electrode 5. Further, as a method for forming p electrode 4 and n electrode 5, for example, a method for evaporating electrode materials by electron beam heating in high vacuum can be adopted. Alternatively, screen printing of pastes containing electrode materials may be adopted. Alternatively, plating of electrode materials may be adopted. The method for forming the electrodes is not limited to the above methods, and an appropriate method using a known technique can be used. Thereafter, back surface electrode 7 is formed using the same means as that for forming p electrode 4 and n electrode 5. Further, preferably, heat treatment at 400° C. to 500° C. is performed after the electrode materials are attached to semiconductor substrate 1 in order to obtain good ohmic contact between semiconductor substrate 1 and p electrode 4, n electrode 5, and back surface electrode 7.

Next, semiconductor substrate 1 is cut with a dicing saw, and thus chip-shaped bypass diodes are completed. When cutting semiconductor substrate 1, laser or the like may be used instead of a dicing saw. Although a chip-shaped bypass diode is shown in FIGS. 3 to 5 for convenience of explanation, actually it is common to perform each step on a large-sized substrate and finally cut the substrate to obtain chip-shaped bypass diodes.

According to the method for manufacturing the bypass diode in the present embodiment, the bypass diode as described in Embodiment 1 can be obtained.

Embodiment 3

Figure 6:
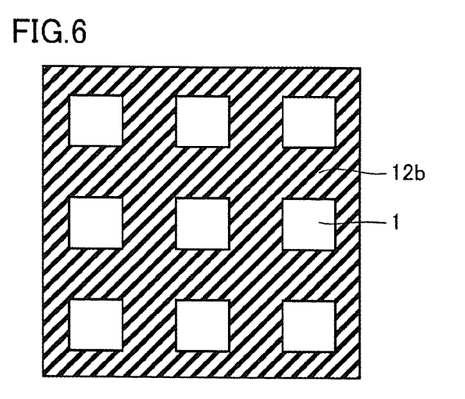
FIG. 6 is an explanatory view of a bypass diode in Embodiment 3 in accordance with the present invention.
Figure 7:
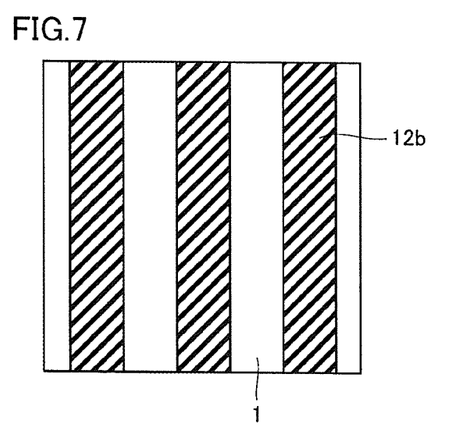
FIG. 7 is an explanatory view of a first variation of the bypass diode in Embodiment 3 in accordance with the present invention.
Figure 8:
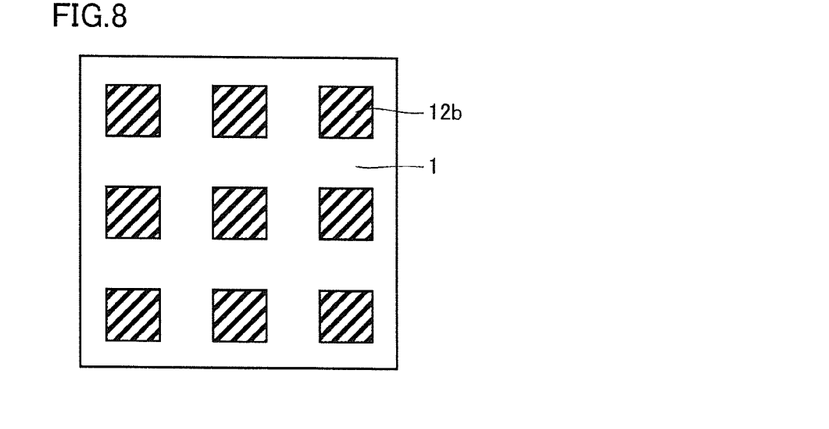
FIG. 8 is an explanatory view of a second variation of the bypass diode in Embodiment 3 in accordance with the present invention.

A bypass diode in Embodiment 3 in accordance with the present invention will be described with reference to FIG. 6. The bypass diode in the present embodiment corresponds to a variation of Embodiment 1. FIGS. 6 to 8 are views of the bypass diode seen from below, i.e., views of the bypass diode seen from the side of the second surface. Although second oxide layer 12b is actually covered with back surface electrode 7, second oxide layer 12b is shown here in a state with back surface electrode 7 removed for convenience of explanation. Although the outer shape is simplified and illustrated as a square here for convenience of explanation, the outer shape of the bypass diode is actually not limited to a square.

As shown in FIG. 6, in the present embodiment, second oxide layer 12b is arranged in a lattice pattern. In the example shown in FIG. 6, second oxide layer 12b, which has been originally formed to cover the entire area, is patterned to be left in a lattice pattern. In other words, small square openings are arranged in a matrix.

By configuring the second oxide layer to be arranged in a lattice pattern as illustrated in the present embodiment, even if the second oxide layer is not symmetrical to the first oxide layer, the pattern of the second oxide layer is substantially uniformly distributed over the entire area, and thus warpage can be alleviated to some extent as a whole.

Hereinafter, a further variation of the present embodiment will be described. The second oxide layer may be arranged in a stripe pattern. FIG. 7 shows one example. In the example shown in FIG. 7, second oxide layer 12b is patterned to be left in a stripe pattern. By configuring the second oxide layer to be arranged in a stripe pattern as described above, even if the second oxide layer is not symmetrical to the first oxide layer, the pattern of the second oxide layer is substantially uniformly distributed over the entire area, and thus warpage can be alleviated to some extent as a whole.

Still another variation will be described. The second oxide layer may be formed by regularly arranging a plurality of basic shapes each isolated from one another. FIG. 8 shows one example. In the example shown in FIG. 8, as second oxide layer 12b, patterns of square basic shapes each isolated from one another are regularly arranged in a matrix. In other words, second oxide layer 12b has a shape formed by removing a lattice-shaped area from second oxide layer 12b which has originally covered the entire area. By configuring the second oxide layer such that a plurality of basic shapes each isolated from one another are regularly arranged as described above, even if the second oxide layer is not symmetrical to the first oxide layer, the pattern of the second oxide layer is substantially uniformly distributed over the entire area, and thus warpage can be alleviated to some extent as a whole.

Preferably, in a case where any of the patterns in Embodiments 1, 3 is adopted as the arrangement of the second oxide layer, the ratio of an area of a portion of second surface 32 which is not covered with second oxide layer 12b to an area of a portion of first surface 31 which is not covered with first oxide layer 12a is more than or equal to 20%. By adopting this configuration, the rates of the oxide layers on the both surfaces are easily balanced, and thus warpage is easily reduced.

Preferably, semiconductor substrate 1 has a thickness of less than or equal to 100 µm. This is because parts used for an artificial satellite are required to be lightweight, and a fully lightweight diode can be obtained when semiconductor substrate 1 has a thickness of less than or equal to 100 μm.

Figure 9:
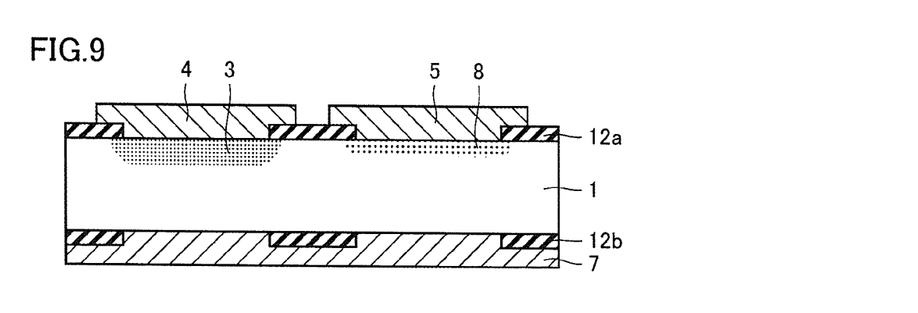
FIG. 9 is a cross sectional view of a variation of the bypass diode illustrated in Embodiments 1, 2 in accordance with the present invention.

It is noted that Embodiments 1, 2 have described a configuration in which only p+ layer 3 is formed through one of two openings in first oxide layer 12a on the upper surface of semiconductor substrate 1. Instead of such a configuration, a configuration in which p+ layer 3 is formed through one of the two openings and an n+ layer is formed through the other of the two openings may be adopted. FIG. 9 shows one example. P+ layer 3 is formed through one opening, and an n+ layer 8 is formed through the other opening. P+ layer 3 is located below p electrode 4, and n+ layer 8 is located below n electrode 5. By forming the n+ layer, ohmic contact between n electrode 5 and semiconductor substrate 1 can be improved. The n+ layer can be formed, for example, by placing this structural body into a quartz furnace heated to 700 to 900° C., and feeding a gas containing phosphorus.

It is noted that a plurality of examples illustrated in the above embodiments may be combined as appropriate and adopted.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention is applicable to a bypass diode for a solar cell.

REFERENCE SIGNS LIST

1: semiconductor substrate; 2a, 2b, 12a, 12b: oxide layer; 3: p+ layer; 4: p electrode; 5: n electrode; 6a, 6b: photoresist; 7: back surface electrode; 8: n+ layer; 16, 17: interconnector; 24: solar cell; 31: first surface; 32: second surface; 101: (conventional) bypass diode; 151: (conventional) solar cell module; 201: bypass diode; 251: solar cell module.

The invention claimed is:

1. A bypass diode, comprising:
    a semiconductor substrate having a first surface and a second surface opposite to each other;
    a first conductive type electrode and a second conductive type electrode arranged on said first surface;
    a back surface electrode arranged on said second surface and having a polarity identical to that of said semiconductor substrate;
    a first oxide layer arranged on said first surface; and
    a second oxide layer arranged on said second surface.

2. The bypass diode according to claim 1, wherein said first oxide layer and said second oxide layer are arranged symmetrically with said semiconductor substrate sandwiched therebetween.

3. The bypass diode according to claim 1, wherein said second oxide layer is arranged in a lattice pattern.

4. The bypass diode according to claim 1, wherein said second oxide layer is arranged in a stripe pattern.

5. The bypass diode according to claim 1, wherein said second oxide layer is formed by regularly arranging a plurality of basic shapes each isolated from one another.

6. The bypass diode according to claim 1, wherein a ratio of an area of a portion of said second surface which is not covered with said second oxide layer to an area of a portion of said first surface which is not covered with said first oxide layer is more than or equal to 20%.

7. The bypass diode according to claim 1, wherein said semiconductor substrate has a thickness of less than or equal to 100 μm.

8. The bypass diode according to claim 1, wherein the back surface electrode is formed integrally.

\* \* \* \* \*